United States Patent
Oshika

(10) Patent No.: US 8,986,446 B2
(45) Date of Patent: Mar. 24, 2015

(54) SI-DOPED GAAS SINGLE CRYSTAL INGOT AND PROCESS FOR PRODUCING THE SAME, AND SI-DOPED GAAS SINGLE CRYSTAL WAFER PRODUCED FROM SI-DOPED GAAS SINGLE CRYSTAL INGOT

(75) Inventor: Yoshikazu Oshika, Tokyo (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 1102 days.

(21) Appl. No.: 12/926,077

(22) Filed: Oct. 25, 2010

(65) Prior Publication Data
US 2011/0059294 A1 Mar. 10, 2011

Related U.S. Application Data

(62) Division of application No. 11/887,573, filed as application No. PCT/JP2006/306215 on Mar. 28, 2006.

(30) Foreign Application Priority Data

Mar. 31, 2005 (JP) ................................. 2005-104995

(51) Int. Cl.
C30B 29/42 (2006.01)
C30B 11/00 (2006.01)
C30B 27/00 (2006.01)
(52) U.S. Cl.
CPC .................. C30B 29/42 (2013.01); C30B 11/00 (2013.01); C30B 27/00 (2013.01)
USPC .................. 117/15; 117/54; 117/82; 117/956
(58) Field of Classification Search
USPC ........................................ 117/13, 54, 82, 956
See application file for complete search history.

(56) References Cited

U.S. PATENT DOCUMENTS 4,504,331 A 3/1985 Kuech et al.
4,528,062 A 7/1985 Kleinhans et al.

(Continued)

FOREIGN PATENT DOCUMENTS

| DE | 10 2004 015 863 A1 | 4/2005 |
|---|---|---|
| JP | B2-03-057079 | 8/1991 |
| JP | A-2000-086398 | 3/2000 |
| JP | A-2000-109400 | 4/2000 |

(Continued)

OTHER PUBLICATIONS

Nov. 8, 2012 Office Action issued in U.S. Appl. No. 11/887,573.
Feb. 3, 2011 Office Action issued in U.S. Appl. No. 11/887,573.

(Continued)

*Primary Examiner* — Bob M Kunemund
(74) *Attorney, Agent, or Firm* — Oliff PLC

(57) ABSTRACT

This invention provides an Si doped GaAs single crystal ingot, which has a low crystallinity value as measured in terms of etch pit density (EPD) per unit area and has good crystallinity, and a process for producing the same. An Si-doped GaAs single crystal wafer produced in a latter half part in the growth of the Si doped GaAs single crystal ingot is also provided. A GaAs compound material is synthesized in a separate synthesizing oven (a crucible). An Si dopant is inserted into the compound material to prepare a GaAs compound material with the Si dopant included therein. The position of insertion of the Si dopant is one where, when the GaAs compound material is melted, the temperature is below the average temperature. After a seed crystal is inserted into a crucible for an apparatus for single crystal growth, the GaAs compound material with the Si dopant included therein and a liquid sealing compound are introduced into the crucible. The crucible is set in the apparatus for single crystal growth, where the mixture is heat melted and, while stirring the liquid sealing compound, the melt is solidified by a vertical temperature gradient method and the crystal is grown to prepare an Si doped GaAs single crystal ingot. In this case, an Si doped GaAs single crystal wafer is also produced in the latter half part of the growth of the ingot.

7 Claims, 8 Drawing Sheets

(56) References Cited

U.S. PATENT DOCUMENTS

| | | |
|---|---|---|
| 5,131,975 A | 7/1992 | Bourret-Courchesne |
| 5,219,632 A | 6/1993 | Shimakura et al. |
| 5,580,382 A | 12/1996 | Jackson et al. |
| 2002/0139296 A1 | 10/2002 | Ohnishi et al. |
| 2004/0187768 A1 | 9/2004 | Itani et al. |
| 2009/0098377 A1 | 4/2009 | Oshika |

FOREIGN PATENT DOCUMENTS

| | | |
|---|---|---|
| JP | A-2004-115339 | 4/2004 |
| JP | A-2004-137096 | 5/2004 |
| JP | A-2004-217508 | 8/2004 |
| JP | A-2004-345888 | 12/2004 |

OTHER PUBLICATIONS

May 31, 2013 Office Action issued in U.S. Appl. No. 11/887,573.
Jun. 19, 2014 Office Action issued in U.S. Appl. No. 11/887,573.

SI-DOPED GAAS SINGLE CRYSTAL INGOT AND PROCESS FOR PRODUCING THE SAME, AND SI-DOPED GAAS SINGLE CRYSTAL WAFER PRODUCED FROM SI-DOPED GAAS SINGLE CRYSTAL INGOT

This is a Division of application Ser. No. 11/887,573 filed Oct. 25, 2007, which in turn is a National Phase of Application No. PCT/JP2006/306215 filed Mar. 28, 2006, which claims priority to Japanese Patent Application No. 2005-104995 filed Mar. 31, 2005. The disclosure of the prior applications is hereby incorporated by reference herein in their entirety.

TECHNICAL FIELD

The present invention relates to an Si-doped GaAs single crystal ingot (may hereinafter be referred to as "ingot") for producing a GaAs single crystal wafer (may hereinafter be referred to as GaAs wafer), which is a material for a GaAs device, to a process for producing the same, and to an Si-doped GaAs single crystal wafer produced from the Si-doped GaAs single crystal ingot.

BACKGROUND ART

The vertical boat method (vertical gradient freeze (VGF) method)) and the vertical Bridgeman method (VB method) are used to carry out crystal growth in order to produce n-type conductivity GaAs single crystal ingots for producing GaAs wafers, which are materials for GaAs (gallium arsenide) devices.

In this case, Si is added as a dopant to the GaAs single crystal in order to provide a carrier to the ingot when an n-type electroconductive ingot is produced. On the other hand, there is a method in which $B_2O_3$ (boric oxide) is used as a liquid sealant for preventing As, which is a volatile component, from dissociating from the ingot, and for achieving other goals when the ingot is produced by the vertical boat method. However, since there is a reaction between $B_2O_3$ and the Si added as a dopant, a phenomenon occurs in which the Si concentration in the ingot becomes difficult to control. As a result, it is difficult to consistently and stably produce an ingot having a desired favorable carrier concentration distribution. In order to solve this problem, the present inventors have proposed in Patent Document 1 the addition of a suitable amount of Si to the liquid sealant in advance, and have proposed in Patent Document 2 the production of an ingot while the liquid sealant is stirred.

On the other hand, since there is a demand for ingots thus produced to have good crystallinity, the present inventors have proposed in Patent Document 3 a method in which a crucible is used to hold GaAs raw material synthesized into a shape that substantially conforms to the internal shape of the crucible, $B_2O_3$ is furthermore placed in the crucible, and the crucible is then heated to fuse the GaAs raw material, the dopant Si raw material, and the $B_2O_3$.

Proposed in Patent Document 4 is a method in which a seed crystal, raw material, and liquid sealant are placed in a bottomed cylindrical growth container, the raw material is heated and melted using a prescribed temperature distribution with the aid of an electric furnace heater disposed so as to surround the growth container, and a compound semiconductor single crystal is vertically grown in order to dispense with the need to provide a furnace temperature distribution designed to make the dopant concentration uniform. In the method, a hole is opened in the block-shaped raw material, a dopant is loaded into the hole, and the raw material is introduced into the growth container to grow an n-type or p-type compound semiconductor single crystal.

Patent Document 1: JP-B 3-57079
Patent Document 2: JP-A 2000-109400
Patent Document 3: JP-A 2004-137096
Patent Document 4: JP-A 2004-345888

DISCLOSURE OF THE INVENTION

Prior-Art Problems

In recent years, advances in electronics technology have produced a need for a high-crystallinity GaAs wafer that has a carrier concentration in a prescribed range. The crystallinity of the GaAs wafer is evaluated in etch pit density per unit surface area (may hereinafter be referred to as EPD), and there is a need for a GaAs wafer having a crystallinity in which the mean EPD is 50 etch pits/$cm^2$ or less, or even 10 etch pits/$cm^2$ or less. However, there are problems in that EPD increases, particularly in the latter half of ingot growth, making it impossible to increase GaAs wafer productivity and increasing the production cost of a GaAs wafer, even if an Si-doped ingot is produced using the methods of Patent Documents 1 and 2.

With the method of Patent Document 3, an ingot having a low EPD and high crystallinity can be produced when the ingot to be produced is not doped or when the dopant is an element other than Si. However, there is a problem in that the crystallinity evaluated in terms of EPD is still reduced in the latter half of the ingot growth when the ingot is doped with Si as the dopant, GaAs wafer productivity cannot be increased, and the production cost of the GaAs wafer is high.

With the method of Patent Document 4, it has become known that, although an effect is achieved in which the reaction between $B_2O_3$ and Si added as a dopant is inhibited, crystallinity evaluated in terms of EPD cannot be increased.

In view of the above, an object of the present invention is to solve the problems described above, and to provide an Si-doped GaAs single crystal ingot in which the value of crystallinity evaluated in terms of EPD is low and good crystallinity is obtained, a process for producing such an ingot, and an Si-doped GaAs single crystal wafer produced in the latter half of the growth of a Si-doped GaAs single crystal ingot.

Means of Solving the Problems

In order to solve the problems described above, the present inventors carried out thoroughgoing research as to the reason that the crystallinity of an ingot evaluated in terms of EPD is reduced when Si is added as a dopant to an Si-doped GaAs single crystal ingot in the methods according to the prior art.

As a result of this research, it was found that the reaction $3Si + 2B_2O_3 \rightarrow 3SiO_2 + 4B$ progresses and B is generated when silicon oxide ($SiO_2$ or $SiO$) is formed in a reaction between Si added as the dopant and $B_2O_3$, which is the liquid sealant described above. The generated B reacts with As in GaAs, i.e., $13B + 2As \rightarrow B_{13}As_2$, thus generating $B_{13}As_2$. This $B_{13}As_2$ then acts as scum, and causes crystallinity evaluated in terms of EPD to be reduced in the latter half of ingot growth in particular.

Based on these results, the present inventors applied the method of Patent Document 3 to an Si-doped GaAs single crystal ingot, and carried out thoroughgoing research concerning the cause of reduced crystallinity in the ingot evaluated in terms of EPD. As a result, a block of GaAs raw material and a piece of Si are added to the crucible for synthesizing the raw material and $B_2O_3$ is added thereon to synthesize an Si-doped GaAs single crystal raw material in advance having the same shape as the internal shape of a crucible. It is thought that when the crucible is heated, the $B_2O_3$, which has a low melting point, becomes a liquid first, flows into the block of GaAs raw material, and makes contact with the Si piece to produce a reaction. $B_{13}As_2$ is generated by the reaction formula described above to form scum. This scum becomes dispersed in the Si-doped GaAs single crystal raw material, and the crystallinity of the ingot evaluated in terms of EPD is therefore ultimately reduced when the ingot is grown using the Si-doped GaAs single crystal raw material.

In order to improve the crystallinity of an ingot evaluated in terms of EPD, the present inventors studied a method that inhibits the generation of scum, and as a result, perfected the present invention having concluded that it is effective to physically prevent molten $B_2O_3$ from making contact with the Si piece.

Specifically, a first aspect for solving the problems is a Si-doped GaAs single crystal ingot for producing an Si-doped GaAs single crystal wafer, wherein the Si-doped GaAs single crystal ingot is one in which $C0.8/C0.1<2.0$, where C0.1 is the carrier concentration in a portion in which the solidification ratio of the ingot is 0.1, and C0.8 is the carrier concentration a portion in which the solidification ratio of the ingot is 0.8; and the average value of crystallinity evaluated in terms of etch pit density is 50 etch pits/cm$^2$ or less in an area in which the solidification ratio is 0.1 or higher and 0.8 or lower.

A second aspect is the Si-doped GaAs single crystal ingot of the first aspect, wherein the Si-doped GaAs single crystal ingot is one in which $C0.8/C0.1<1.4$.

A third aspect is the Si-doped GaAs single crystal ingot of the second aspect, wherein the Si-doped GaAs single crystal ingot is one in which the average value of crystallinity evaluated in terms of etch pit density is 10 etch pits/cm$^2$ or less in an area in which the solidification ratio is 0.1 or higher and 0.8 or lower.

A fourth aspect is the Si-doped GaAs single crystal ingot of any of the first through third aspects, wherein the Si-doped GaAs single crystal ingot is one in which the carrier concentration is $1.0\times10^{17}$/cm$^3$ or higher and $1.0\times10^{19}$/cm$^3$ or lower in an area in which the solidification ratio in the ingot is 0.1 or higher and 0.8 or lower.

A fifth aspect is an Si-doped GaAs single crystal wafer produced from an area in which the solidification ratio is 0.6 or higher and 0.8 or lower in the Si-doped GaAs single crystal ingot of any of aspects 1 through 4, wherein the Si-doped GaAs single crystal wafer is one in which the average value of crystallinity evaluated in terms of etch pit density is 50 etch pits/cm$^2$ or less.

A sixth aspect is the Si-doped GaAs single crystal wafer of the fifth aspect, wherein the Si-doped GaAs single crystal wafer is one in which the average value of crystallinity evaluated in terms of etch pit density is 10 etch pits/cm$^2$ or less.

A seventh aspect is the Si-doped GaAs single crystal wafer of the fifth or sixth aspect, wherein the Si-doped GaAs single crystal wafer is one in which the carrier concentration is $1.0\times10^{17}$/cm$^3$ or higher and $1.0\times10^{19}$/cm$^3$ or lower.

An eighth aspect is a process for producing an Si-doped GaAs single crystal ingot in which GaAs raw material, Si as a dopant raw material, and $B_2O_3$ as a raw material for a liquid sealant are set in a crucible and then heated; the raw materials are melted; a layer of the liquid sealant is placed on the GaAs raw material melt layer; and prescribed crystal growth is carried out thereafter, the process for producing an Si-doped GaAs single crystal ingot comprising:

a step for fabricating GaAs raw material synthesized into a shape that substantially conforms to the internal shape of the crucible;

a step for placing the dopant raw material in the center of the GaAs raw material at a temperature that is lower than the average temperature of the GaAs raw material when the GaAs raw material is melted; and a step for placing inside the crucible the GaAs raw material in which the dopant raw material is disposed, placing the raw material for the liquid sealant inside the crucible, and thereafter heating the crucible.

The ninth aspect is the process for producing an Si-doped GaAs single crystal ingot of the eighth aspect, wherein the process for producing an Si-doped GaAs single crystal ingot is one in which the crucible is heated; the GaAs raw material, the dopant raw material, and the raw material for the liquid sealant are melted; and a GaAs single crystal is grown while the liquid sealant is stirred using stirring means.

An ingot having the configuration of the first aspect can [be used to] produce a GaAs wafer having good crystallinity from a broad area that extends from a portion having a solidification ratio of 0.1 to a portion having a solidification ratio of 0.8. As a result, productivity can be improved in the production of a GaAs wafer An ingot having the configuration of the second aspect has, in addition to the first aspect, a narrow width of carrier concentration fluctuation. As a result, a GaAs wafer having uniform quality can be produced with high productivity.

In accordance with an ingot having the configuration of the third aspect, a GaAs wafer having improved crystallinity can, in addition to the first and second aspects, be produced across a broad area that extends from a portion having a solidification ratio of 0.1 to a portion having a solidification ratio of 0.8.

An ingot having the configuration of the fourth aspect can, in addition to the first to third aspects, be used to produce a GaAs wafer designed for semiconductor elements and required to have electroconductivity, which includes applications such as laser diodes and light-emitting diodes, from a broad area that extends from a portion having a solidification ratio of 0.1 to a portion having a solidification ratio of 0.8.

As a result of being able to obtain a GaAs wafer having the configuration of the fifth aspect, the productivity of GaAs wafers having excellent crystallinity, in which the average value of crystallinity evaluated in terms of etch pit density is 50 etch pits/cm$^2$ or less, can be improved by about 40% in comparison with the prior art.

A GaAs wafer having the configuration of the sixth aspect is, in addition to the fifth aspect, a GaAs wafer having further improved crystallinity.

A GaAs wafer having the configuration of the seventh aspect is, in addition to the fifth and sixth aspects, a GaAs wafer that must be electroconductive and is suitable for producing semiconductor elements, which includes applications such as laser diodes and light-emitting diodes.

In accordance with the process for producing an ingot having the configuration of the eighth aspect, an ingot having good crystallinity can be grown across a wide area of solidification ratios because thick GaAs raw material melt is present between the dopant Si and the $B_2O_3$ when the GaAs raw material around the dopant Si is melted.

In accordance with the process for producing an ingot having the configuration of the ninth aspect, an ingot having a narrow width of carrier concentration fluctuation can, in addition to the eighth aspect, be grown across a wide range of solidification ratios.

BEST MODE FOR CARRYING OUT THE INVENTION

Preferred embodiments of the present invention are described below.

The ingot according to the present invention is an ingot for producing a GaAs wafer.

The solidification ratio of the ingot according to the present invention is the ratio of the weight of a suitably sectioned portion on a lateral end of the seed crystal in the ingot and the total weight of the ingot, presuming a suitable cross section perpendicular to the growth direction of the ingot. Specifically, the solidification ratio is a parameter that shows the correspondence of the suitable cross section to the point in time at which the solidification that accompanies the ingot growth has progressed to a certain extent in an ingot growing process in which cooling is started for a melted GaAs raw material melted in a crucible placed in a crystal growing apparatus, solidification is started from the side that is in contact with the GaAs seed crystal, and an ingot is grown. Therefore, the state in which the entire GaAs raw material has melted is set to a solidification ratio of 0, the completely solidified state is set to a solidification ratio of 1, and the solidification that has progressed from the seed crystal side is set to a solidification ratio 0.5 when 50% of the entire amount of GaAs raw material has solidified.

Here, the Si-doped GaAs single crystal ingot has a feature in which $C0.8/C0.1 < 2.0$, where $C0.1$ is the carrier concentration in a sectioned portion in which the solidification ratio is 0.1, and $C0.8$ is the carrier concentration in a sectioned portion in which the solidification ratio is 0.8 when it is determined, based on the weight of a suitable transverse portion on a lateral end of the seed crystal in the ingot, and the total weight of the ingot, which sectioned portion is in temporal correspondence with a certain value of the solidification ratio when crystallization/solidification takes place in the ingot production process in sequence from the surface that is in contact with the seed crystal; and in that the average value of crystallinity evaluated in terms of etch pit density is 50 etch pits/cm$^2$ or less in an area in which the solidification ratio is 0.1 or higher and 0.8 or lower. As a result of having such a configuration, the ingot of the present invention makes it possible to produce a GaAs wafer having good crystallinity from a broad area that extends from a portion having a solidification ratio of 0.1 to a portion having a solidification ratio of 0.8.

On the other hand, the productivity of the GaAs wafer can be improved by about 40% or more by obtaining a GaAs wafer produced from an area that extends from a portion having a solidification ratio of 0.6 to a portion having a solidification ratio of 0.8, in contrast to a GaAs wafer having the carrier concentration and crystallinity described above produced from an area that extends from a portion having a solidification ratio of 0.1 to a portion having a solidification ratio of 0.6.

The ingot according to the present invention makes it possible, by adopting a configuration in which $C0.8/C0.1 < 1.4$, to produce a GaAs wafer in which the carrier concentration has a narrow fluctuation width, the quality is uniform, and the productivity is high. As a result of being able to obtain a GaAs wafer having the carrier concentration and crystallinity described above from an area in which the solidification ratio of the ingot ranges from 0.6 to 0.8, the productivity of the GaAs wafer can be improved by about 40% or more.

The ingot according to the present invention makes it possible, by adopting a configuration in which the average value of crystallinity evaluated in terms of etch pit density is 10 etch pits/cm$^2$ or less in an area in which the solidification ratio is 0.1 or higher and 0.8 or lower, to produce a GaAs wafer in which the crystallinity is further improved in the sense that the average value of crystallinity evaluated in terms of etch pit density is 10 etch pits/cm$^2$ or less. As a result of being able to obtain a GaAs wafer having the carrier concentration and crystallinity described above from an area in which the solidification ratio of the ingot ranges from 0.6 to 0.8, the productivity of the GaAs wafer can be improved by about 40% or more.

The ingot according to the present invention, in addition the configuration described above, makes it possible to produce a GaAs wafer in which the fourth power of the B concentration divided by the cube of the Si concentration is less than $1.0 \times 10^{19}$/cm$^3$, the concentration decreases to one that is less than the saturation solubility of B in the GaAs melt, and in which the B concentration is low and productivity is high. B has a light-absorbing property, and the characteristics of an optical element can therefore be improved and a preferred configuration obtained by reducing the concentration of B in the optical element.

Furthermore, the ingot according to the present invention, in addition the configuration described above, allows a GaAs wafer having a prescribed electroconductivity to be produced with high productivity by adopting a configuration in which the carrier concentration is $1.0 \times 10^{17}$/cm$^3$ or higher and $1.0 \times 10^{19}$/cm$^3$ or lower. A GaAs wafer having the prescribed electroconductivity and being produced from such an ingot has a preferred configuration that can be advantageously used in laser diode applications and light-emitting diode applications.

Next, the method of producing an ingot according to the present invention is described below with reference to the diagrams. FIG. 1 is a longitudinal sectional view showing the schematic configuration of a crystal growing apparatus 1. FIG. 2 is a longitudinal sectional view of a crucible 1. The crystal growing apparatus 1 allows a GaAs single crystal to be produced by the vertical gradient freeze (VGF) method, which is a vertical boat method.

A crucible 11 is disposed in the center of the interior of an airtight container 10, as shown in FIG. 1. The crucible 11 is provided with a cylindrical portion 12 that opens at the upper end, and a conical portion 13 connected so as to block the lower portion of the cylindrical portion 12. A seed crystal portion 14 for inserting a seed crystal is formed in the apical portion (lowest portion of the crucible 11) of the conical portion 13. The seed crystal portion 14 is blocked by a cap 50.

The crucible 11 is held in a cylindrically-shaped crucible-holding container 20 whose bottom surface is closed. The crucible-holding container 20 is supported by the upper end of a rod 21, as shown in the diagram. The lower end of the rod 21 protrudes below the airtight container 10 via a seal ring 22 mounted on the lower surface of the airtight container 10, and a rotating elevator mechanism 23 is connected to the lower end of the rod. The rotating elevator mechanism 23 can be operated to integrally rotate and raise or lower the crucible-holding container 20 and the crucible 11 via the rod 21. The airtight container 10 is kept airtight by the seal ring 22.

A plurality of heaters 25 are disposed at various heights in the airtight container 10 so as to surround the crucible-holding container 20. The temperature of the heaters 25 at various heights can each be controlled independently, and a desired temperature gradient and temperature distribution can be formed in the vertical direction in the airtight container 10. The outside of the heaters 25 is enclosed by an insulation material 26, and the heat of the heaters 25 is effectively transmitted to the crucible-holding container 20.

In the crystal growing apparatus 1 configured in this manner, a seed crystal 30 is inserted in the seed crystal portion 14 of the crucible 11, the seed crystal portion 14 is then blocked by the cap 50, and the GaAs raw material is synthesized into a shape that substantially conforms to the internal shape of the crucible. A section 31B (hereinafter referred to as Si-holding GaAs raw material 31B), in which Si is introduced in the center of the interior below the GaAs raw material, and $B_2O_3$, which is a liquid sealant 32, are loaded into the crucible 11.

Here, the Si-holding GaAs raw material will be described. FIG. 3 is a perspective view of a GaAs compound raw material 31A prior to introducing Si in the Si-holding GaAs raw material described above. The GaAs compound raw material 31A is composed of a cylindrical portion 35 and a truncated conical portion 36 disposed at the lower end of the cylindrical portion 35. The diameter d of the cylindrical portion 35 is equal to or less than the inside diameter of the cylindrical portion 12 of the crucible 11, and the height h of the cylindrical portion 35 is set to be equal to or less than the height of the cylindrical portion 12 of the crucible 11. The truncated conical portion 36 has a slope angle that exactly fits into the interior of the conical portion 13 of the crucible 11.

An example of the method for producing such a GaAs compound raw material 31A will be described using FIG. 4. FIG. 4 is a cross-sectional view the manner in which Ga raw material 41 and As raw material 42, which are raw materials for synthesizing a GaAs compound raw material 31, and $B_2O_3$ or another liquid sealant 32 are loaded (charged) into the interior of a synthesizing crucible 40, which, except for the height, has the same shape as the interior of the crucible 11 shown in FIG. 2. The height of the crucible 40 is preferably the same or greater than that of the crucible 11. The material of the crucible 40 has a required heat resistance, is a material that has poor reactivity with the raw material melt, and is a boron nitride (BN) material, for example. The crucible 11 for growing crystals in the crystal growing apparatus 1 may be used directly as the crucible 40 for synthesizing a GaAs compound raw material 31 in this manner.

A spacer 46 is placed instead of the seed crystal 30 in the seed crystal portion 45 of the crucible 40 when the GaAs compound raw material 31A is synthesized in this manner. The material of the spacer 46 has a required heat resistance, is a material that has poor reactivity with the raw material melt, and is a boron nitride (BN) material, for example. With this spacer 46, Si is held in the manner described below in the resulting GaAs compound raw material 31A to produce the Si-holding GaAs raw material 31B, and the material is loaded into the crucible 11, whereupon the lower end of the truncated conical portion 36 acts to adjust the height of the lower end of the truncated conical portion 36 so that the seed crystal 30 inserted into the seed crystal portion 14 of the crucible 11 is not depressed. When the crucible 40 having an open lower end is used, the spacer 46 can be inserted from below the crucible 40, and the opening at the lower end of the crucible 40 can be blocked, as shown in the diagram.

The Ga raw material 41, the As raw material 42, the liquid sealant 32, and other materials loaded into the crucible 40 are heated, melted, solidified, and synthesized. In this manner, a GaAs compound raw material 31A can be obtained as shown in FIG. 3. When the GaAs compound raw material 31A is produced in this manner, the heating and cooling conditions do not necessarily need to be the same as those used to produce an ingot 33. Considering productivity, for example, the GaAs compound raw material 31A may be synthesized via rapid cooling to achieve polycrystalline solidification. However, the solidification preferably occurs in a single direction from the lower portion of the crucible 40 to the upper portion using the same vertical gradient freeze method as that used when the ingot 33 is produced, in order to effectively remove impurities in the raw materials and oxides generated in the melting and solidification steps.

The liquid sealant 32 forms a congealed state on the upper surface of the ingot 33 because the liquid sealant 32 is also loaded into the crucible 40.

The manner in which the dopant raw material is introduced into the GaAs compound raw material will be described hereinbelow with respect to FIG. 5. FIG. 5 is a perspective view of a process in which a dopant raw material is introduced into the GaAs compound raw material.

When the synthesized GaAs compound raw material is removed from the crucible and the GaAs compound raw material is melted, the dopant raw material is introduced into the center of the GaAs compound raw material at a temperature that is lower than the average temperature of the GaAs compound raw material. The location in which the dopant raw material is placed is one in which the average temperature of the GaAs compound raw material is lower with respect to the temperature distribution in the growth direction along the center axis of the raw material when the GaAs compound raw material is actually heated and melted. Adopting such a configuration allows the timing for melting the doughnut plate around the dopant Si to be delayed, and as a result, an ingot having excellent crystallinity can be produced in that the average value of crystallinity evaluated in terms of etch pit density is 10 etch pit/cm$^2$ or less. The method for determining the average temperature of the GaAs compound raw material and the method for determining the placement location of the dopant raw material will be described later.

The GaAs doughnut plate 37 has the same composition as the GaAs compound raw material 31 and the same outside diameter as the cylindrical portion 35. The thickness is, e.g., 10 mm, and the diameter of the doughnut-shaped inner hole 38 is, e.g., 20 mm. In this case, Si 39, which is the prescribed dopant raw material, is introduced into the doughnut-shaped inner hole 38 when the GaAs doughnut plate 37 is held between the cylindrical portion 35 and the truncated conical portion 36. At this point, the thickness of the GaAs doughnut plate 37 and the diameter of the doughnut-shaped inner hole 38 are set to dimensions that allow the dopant 39 to be held inside the inner hole 38.

The dopant raw material is introduced into the GaAs compound raw material, and the raw material is thereafter loaded into the crucible of a crystal growing apparatus. This loading process will be described with reference to FIG. 6. FIG. 6 is a cross-sectional view of a GaAs compound raw material that has been loaded into the crucible of a crystal growing apparatus.

The Si-holding GaAs raw material 31B in which the Si 39 surrounded by the GaAs doughnut plate 37 is disposed is loaded into the crucible 11 of the crystal growing apparatus 1, as shown in FIG. 6. At this point, the raw material for the liquid sealant 32 is also placed in the upper portion of the Si-holding GaAs raw material 31B. The seed crystal 30 is inserted into the seed crystal portion 14 of the crucible 11. In this case, if the crucible 11 is one in which the lower portion is open as shown in FIG. 6, the seed crystal 30 can be inserted from below and the opening can be blocked by the cap 50. The seed crystal 30 can thereby be easily disposed in the seed crystal portion 14.

In this manner, the Si-holding GaAs raw material 31B can be loaded into the crucible 11 essentially without gaps. Since the height of the lower end of the truncated conical portion 36 is adjusted by placing a spacer 46 in the seed crystal portion 45 of the crucible 40 when the GaAs compound raw material 31 is solidified inside the crucible 40 shown in FIG. 4, there is no concern that, when the Si-holding GaAs raw material 31B is loaded into the crucible 11 in FIG. 6, the lower end of the truncated conical portion 36 will depress the seed crystal 30 that has been inserted into the seed crystal portion 14 of the crucible 11.

Returning to FIG. 1, the Si-holding GaAs raw material 31B is loaded into the crucible 11, the crucible 11 is set inside the crucible-holding container 20 in a state in which the seed crystal 30 has been inserted into the seed crystal portion 14, the interior of the airtight container 10 is pressurized to a prescribed pressure and then heated using a heater 25, a prescribed temperature distribution is formed, and the entire Si-holding GaAs raw material 31B is heated.

When the heating of the crucible is started, first, the $B_2O_3$ is melted and most of the material is liquefied and retained in the upper portion of the Si-holding GaAs raw material 31B. A portion is thought to pass through the gap between the crucible 11 and the Si-holding GaAs raw material 31B and reach to the lower portion of the crucible. On the other hand, since the dopant 39 is held in the internal center area of the lower portion of the Si-holding GaAs raw material 31B, which has a shape that substantially conforms to the internal shape of the crucible, the two are physically prevented from making contact with each other. When the temperature of the crucible increases further, melting begins from the upper portion of the Si-holding GaAs raw material 31B in accordance with the temperature distribution. In this situation, the $B_2O_3$ melt, which has a lower specific gravity than the GaAs raw material melt, is pushed upward to the upper portion of the crucible 11. When the temperature of the crucible increases further and the GaAs raw material surrounding the dopant 39 is dissolved, the GaAs raw material melt is thick between the dopant 39 and the $B_2O_3$ melt which is the liquid sealant 32. Therefore, the B concentration in the raw material melt is low and scum is not generated.

Next, a temperature gradient is formed in the GaAs compound raw material that has become a melt inside the crucible 11 by controlling the temperature of the heaters 25, the raw material melt is cooled in accordance with the vertical gradient freeze method, the GaAs compound raw material is gradually cooled and solidified from the lowest portion that is in contact with the seed crystal 30, and the ingot 33 is made to grow. The dopant is diffused in the GaAs raw material melt when the ingot 33 begins to grow, and a portion of the dopant makes contact with the liquid sealant 32. However, since contact is made via the GaAs melt, localized increases in the B concentration do not occur, and the generation of scum can essentially be ignored. As a result, the B concentration of the entire ingot remains low, and the generation of scum and coarsening are reduced. As a further result, an ingot 33 having a desired carrier concentration throughout the ingot and good crystallinity evaluated in terms of EPD can be grown.

The ingot 33 may be grown while rotating and increasing the temperature of the crucible 11 by operating the rotating elevator mechanism 23 as required.

In this manner, the entire GaAs compound raw material is solidified and changed into an ingot 33. The ingot 33 is then cooled and the ingot 33 is removed from the crucible 11.

The configuration described above makes it possible to physically prevent contact between the dopant 39 and the liquid sealant 32 until the melting of the Si-holding GaAs raw material 31B has been completed. As a result, it is possible to assume that the following series of reactions can be inhibited: one in which the Si and the molten $B_2O_3$ make direct contact that results in the reaction $3Si+2B_2O_3 \rightarrow 3SiO_2+4B$; one in which a high concentration of B is locally present in portions that are in contact with the GaAs prior to melting resulting in the chemical reaction $13B+2As \rightarrow B_{13}As_2$ that progresses to generate scum having a $B_{13}As_2$ composition; and one in which the B in the melt is taken into the ingot during ingot 33 growth and the ingot is coarsened, forming starting points for nucleation, and dislocations are ultimately produced. In other words, in the present invention, the contact made between the Si and the molten $B_2O_3$ occurs after the melting of the GaAs compound raw material has been completed. Therefore, the Si makes contact with the $B_2O_3$ after the molten GaAs compound has already been sufficiently diluted. As a result, the B concentration in the melt is reduced and the generation of scum and coarsening of the ingot can be inhibited by markedly reducing the frequency of chemical reactions that generate the B described above. Therefore, the average value of crystallinity evaluated in terms of etch pit density can be reduced to 10 etch pits/cm² or less in the latter half area in the growth of the ingot.

As a result, an ingot can be produced in which the average value of crystallinity evaluated in terms of etch pit density is 10 etch pits/cm² or less in an area in which the solidification ratio in the ingot is 0.6 or higher and 0.8 or lower, where the solidification ratio is determined from the total weight of the produced ingot, the weight of the suitable section on a lateral end of the seed crystal in the ingot, and the weight of a suitable section of the other end when crystallization and solidification has taken place in sequence from the surface in contact with the seed crystal in the process for producing the ingot.

The relationship between the present invention and the solidification ratio in the ingot will briefly be described below.

With the prior art, the etch pits and other distortions generated in the crystal growth are relatively few in the early stages of the ingot growth in which the solidification ratio of an actual product is, e.g., 0.1 or higher and less than 0.6, but distortions in the crystal growth become dramatic in the latter stages of ingot growth in which the solidification ratio is 0.6 or higher.

Therefore, wafer productivity and production costs are markedly affected by the maximum allowable value of the solidification ratio in the ingot at which high-quality wafers can still be obtained.

The ingot 33 produced via the production method described above has a low dislocation density, e.g., a maximum of 200 dislocations/cm² or less and an average of 10 dislocations or less/cm². The shape of the Si-holding GaAs raw material 31B is not necessarily required to be the same shape as the ingot 33, and the surface area of the Si-holding GaAs raw material 31B prior to melting (prior to heating and melting the Si-holding GaAs raw material 31B in the crystal growing apparatus 1) may be no more than five times the surface area of the ingot 33 produced using the Si-holding GaAs raw material 31B. This is due to the fact that as long as the surface area of the Si-holding GaAs raw material 31B prior to melting is no more than five times the surface area of the ingot 33 produced using the Si-holding GaAs raw material, fluctuation of the Ga/As ratio can be reduced, fewer dislocations are generated inside the ingot 33 grown by the stated effect, and an ingot 33 having a low dislocation density can be stably produced. The amount per unit volume that can be loaded into the crucible 11 can be increased and production efficiency can be improved by adopting such a configuration. The surface area of the Si-holding GaAs raw material 31B prior to melting is preferably double or less than the surface area of the ingot 33 produced from the Si-holding GaAs raw material, and is even more preferably 1.5 times or less in order to obtain an ingot 33 having a lower dislocation density and a more stable Ga/As ratio.

More preferably, it is apparent that the fourth power of the B concentration divided by the cube of the Si concentration is less than $1.0 \times 10^{19}/cm^3$ in an area in which the solidification ratio is 0.6 or higher and 0.8 or lower in relation to the ingot produced using the stated method. This is thought to be one result of the effect in which B, usually transported into the GaAs compound single crystal in the form of scum or via incorporation into the melt, is dramatically reduced by the configuration of the present invention described above.

Preferred embodiments of the present invention were described above, but the present invention is not limited to the embodiments described herein. For example, the configuration may be one in which a perforation having a prescribed diameter and depth is provided below the GaAs compound raw material 31 instead of using the GaAs doughnut plate 37 described above, a prescribed dopant 39 is held in the perforation, and the perforation is blocked by the GaAs compound raw material in order to obtain a GaAs compound raw material 31 in which a prescribed dopant 39 is held.

Other embodiments of the present invention will be described below with reference to the diagrams. FIG. 7 is a longitudinal sectional view showing a crystal growing apparatus 101 that has a stirring member and the configuration of the crystal growing apparatus 1 described with reference to FIG. 1. In FIG. 7, the portions having the same configuration as that described in FIG. 1 have the same reference numerals and a description of these portions will be omitted.

A through-hole that passes through an upper rod 102 is formed in the upper portion of the airtight container 10, a seal ring 111 is fitted into the through-hole, and the upper rod 102 rotates and moves in the vertical direction while keeping the airtight container 10 airtight.

The upper rod 102 can be precisely rotated and moved in the vertical direction with the aid of a drive mechanism (not shown), a rotating shaft 121 is connected to the distal end of the upper rod, and a stirring plate 110 is mounted on the rotating shaft 121 to form a stirring member 120. The lowest portion of the member constituting the stirring plate 110 is the stirring plate lower end 119. In this case, the stirring plate 110 is a material that has the required heat resistance and is not liable to react with the raw material melt. Advantageous examples of such a material include carbon (C) and pBN (Pyrolytic BN).

Here, the mechanism that makes it possible to produce an excellent quality ingot by stirring the $B_2O_3$ layer, which is the liquid sealant 32, with the aid of the stirring member 120 will be described.

The melted portion 31 of the GaAs, in which Si melted in the crucible 11 is dispersed, is made to begin to solidify from the portion that is in contact with the seed crystal 30 by controlling the heaters 25. During this solidification, the dopant Si is present in larger amounts in the melted portion that in the solidified portion in accordance with the segregation coefficient of the Si. The solidified portion increases in size and the melted portion decreases in size as solidification progresses. At this time, the Si concentration of the melted portion continuously increases, and the Si concentration in the latter half of crystal growth therefore increases exponentially. This is therefore thought to be the reason a carrier concentration distribution is generated in which the ratio of the carrier concentration C0.1 at a solidification ratio of 0.1 and the carrier concentration C0.8 at a solidification ratio of 0.8 in the resulting ingot is C0.8/C0.1>10.

Here, the present inventors forcibly stirred the liquid sealant 32 using the stirring member 120 and caused the Si in the melted portion to be absorbed into the liquid sealant 32 while maintaining a prescribed ratio. When the Si in the melted portion is made to be absorbed into the $B_2O_3$, B is taken into the melted portion by way of the reaction formula described above. However, as described above, the generation of scum and the coarsening [of the ingot] can be reduced because the B concentration in the GaAs melt immediately after growth has started is sufficiently low in comparison with the saturation solubility, and because the B concentration does not increase locally when the $B_2O_3$ is stirred. As a result, the value of crystallinity evaluated in terms of EPD described above is good, and an Si-doped GaAs single crystal wafer can be produced having an Si concentration of $1.0 \times 10^{17}$ to $1.0 \times 10^{19}/cm^3$.

Success can be achieved in reducing the formation of a carrier concentration distribution by adopting a configuration in which the $B_2O_3$ layer is stirred using a stirring member, and an Si-doped GaAs single crystal ingot in which the average value of crystallinity, as evaluated in terms of etch pit density, is 10 etch pits/cm² or less can be produced while achieving the aforementioned good carrier concentration distribution of C0.8/C0.1<1.4 as the desired carrier concentration.

The method for determining the average temperature of the GaAs compound raw material 31A and the placement of the dopant raw material is described below with reference to FIG. 8. FIG. 8 is a graph in which the temperature is plotted on the horizontal axis and the distance from the contact point between the seed crystal and the truncated conical portion in the GaAs compound raw material is plotted on the vertical axis, and shows a plot of the temperature at each position of the GaAs compound raw material. For reference, the cross section of the GaAs compound raw material is shown on the left side of the graph.

When the GaAs compound raw material is heated, the upper portion from a prescribed point β in the raw material is set to be a constant temperature a° C., and the contact point between the seed crystal and the truncated conical portion 36 is set to be b° C., which is the same or slightly higher temperature than the melting point of the seed crystal. In this case, a temperature profile z of the raw material has a temperature increase component x and a constant temperature component y. In actuality, the temperature profile z is obtained in advance by inserting a thermocouple in the center of the molten raw material and vertically moving the thermocouple, and the heating conditions of the heaters that can produce the desired temperature profile z are calculated. Here, the average temperature (ave)° C. can be calculated using the following formula, where α is the position of the liquid level of the raw material.

Formula: $(ave)° C.=b+[(a-b)\times(\alpha-\beta)+(a-b)\times\beta\times\frac{1}{2}]/\alpha$ For example, (ave)° C.=1,343° C. when a=1,350° C., b=1,270° C., α=300 mm, and β=50 mm.

Next, in FIG. 8, the dopant raw material is preferably placed in the position of γ or in a position below γ, where w is the (ave)° C., and γ is the position of the intersection of w and x. In other words, the dopant raw material is introduced into the center area of the GaAs raw material, where the temperature is lower than the average temperature of the GaAs compound raw material.

Adopting such a configuration allows the timing for melting the doughnut plate or another GaAs form around the dopant Si to be delayed. As a result, the average crystallinity as evaluated in terms of etch pit density can be reduced about ½, i.e., to 10 etch pits/cm² or less in comparison with the case in which the dopant raw material is introduced into the upper portion above γ (the center interior of the GaAs raw material, where the temperature is higher than the average temperature of the GaAs compound raw material).

The present invention described above is not limited to the vertical gradient freeze method, and the vertical Bridgeman method or other methods may be used. The present invention is also not limited to a vertical boat method, and the present invention may also be applied in a horizontal boat method.

EXAMPLES

The present invention is described in greater detail below using examples.

Example 1

First, a GaAs compound raw material was synthesized using a separate synthesizing reactor (crucible). The value obtained by dividing the surface area of the synthesized GaAs compound raw material by the surface area of a GaAs single crystal that was grown thereafter using the GaAs compound raw material was 1.05. The synthesized GaAs compound raw material was cut and adjusted, and was furthermore cut into a cylindrical portion and a conical portion. A GaAs compound raw material in the form of a doughnut having the same outside diameter as the cylindrical portion and holding the Si dopant in the inner hole of the doughnut was inserted into the cut portion. The average temperature (ave)° C. was calculated to be 1,298° C. from the temperature profile that was used when the GaAs compound raw material described below was heated, and the insertion position was therefore located below the position that corresponds to this temperature (the temperature of the position was calculated to be 1,281° C.). The total weight of the GaAs compound raw material was 6.9 kg, and the amount in which the Si dopant was introduced was 200 wt ppm.

The seed crystal was introduced into the crucible of a single-crystal growing apparatus, and the GaAs compound raw material into which the Si dopant had been introduced was thereafter loaded into the crucible. Next, 365 g of boric anhydride ($B_2O_3$) was loaded as the liquid sealant. The crucible prepared in this manner was set in a crucible-holding container of the single-crystal growing apparatus, and the raw material was heated with the aid of heaters. The temperature distribution at this time was set to 1,270° C. at the contact point between the truncated conical portion and the seed crystal, and the area above a prescribed point β was set to a constant temperature of 1,310° C. At this time, the average temperature (ave)° C. was 1,298° C. Under these conditions, an area at 1,298° C. or less was determined from the temperature profile, and the Si dopant was placed in this area. In the present example, the position was set to be at 1,281° C. After melting was completed, the melt was solidified and crystals were grown via the vertical freeze gradient method in a state in which the liquid sealant had been placed in the upper portion of the raw material melt. At this time, a distance of 5 mm was maintained from the boundary between the raw material and the liquid sealant, and a stirring vane was placed in the liquid sealant and was rotated at 2 rpm to stir the material and grow the crystal.

The temperature gradient in the boundary between the melt and the solidified crystal at this time was 3° C./cm, and the rise rate of the boundary between the melt and the solidified crystal was 3 mm/hr.

The carrier concentration of the ingot obtained in this manner was $0.9 \times 10^{18}/cm^3$ in an area in which the solidification ratio was 0.1 (C0.1), the carrier concentration was $1.1 \times 10^{18}/cm^3$ in an area in which the solidification ratio was 0.8 (C0.8), and the ratio C0.8/C0.1 was 1.22.

The ingot was sliced and polished in the vertical and growth directions, and the dislocation density was measured by immersing samples in KOH at 300° C. The value of crystallinity evaluated in terms of etch pit density was 9 etch pits/$cm^2$ in an area in which the solidification ratio in the ingot was 0.6 of higher and 0.8 or lower. The value obtained by dividing the fourth power of the B concentration by the cube of the Si concentration in the same area was $0.87 \times 10^{19}/cm^3$.

The same test as example 1 described above was carried out ten times, and the same measurements were taken.

The result was C0.8/C0.1<1.4 in both cases. The value of crystallinity evaluated in terms of etch pit density was 0 to 10 etch pits/$cm^2$ in an area in which the solidification ratio in the ingot was 0.6 of higher and 0.8 or lower, and the value obtained by dividing the fourth power of the B concentration by the cube of the Si concentration was $0.65 \times 10^{19}/cm^3$ to $0.89 \times 10^{19}/cm^3$.

Example 2

The same apparatus and raw material as those described in example 1 were used, but the Si dopant was placed in a position at 1,327° C. rather than 1,281° C. when the dopant was inserted into the GaAs compound raw material. The same operation as in example 1 was then carried out to produce a GaAs ingot.

The carrier concentration of the resulting GaAs ingot was $0.9 \times 10^{18}/cm^3$ in an area in which the solidification ratio was 0.1 (C0.1), the carrier concentration was $1.1 \times 10^{18}/cm^3$ in an area in which the solidification ratio was 0.8 (C0.8), and the ratio C0.8/C0.1 was 1.22.

The value of crystallinity evaluated in terms of etch pit density was 10 etch pits/$cm^2$. The value obtained by dividing the fourth power of the B concentration by the cube of the Si concentration was $0.93 \times 10^{19}/cm^3$ in the same area.

The same test as example 2 described above was carried out ten times, and the same measurements were taken. The result was C0.8/C0.1<1.4 in both cases. The value of crystallinity evaluated in terms of etch pit density was 0 to 10 etch pits/$cm^2$.

Comparative Example 1

The same apparatus and raw material as those described in example 1 were used, but the GaAs compound raw material was loaded into the crucible of a single-crystal growing apparatus as the crushed raw material that had not been synthesized in a separate synthesizing reactor, and the Si dopant was introduced into the crushed raw material in a normal manner. The amount of Si dopant that was loaded at this time was 280 wt ppm.

Other conditions were set to be the same as those in example 1, and a GaAs ingot was obtained.

The carrier concentration of the GaAs ingot obtained in this manner was $0.9 \times 10^{18}/cm^3$ in an area in which the solidification ratio was 0.1 (C0.1), the carrier concentration was $1.1 \times 10^{18}/cm^3$ in an area in which the solidification ratio was 0.8 (C0.8), and the ratio C0.8/C0.1 was 1.22.

The value of crystallinity evaluated in terms of etch pit density was 250 etch pits/$cm^2$ in an area in which the solidification ratio in the ingot was 0.6 of higher and 0.8 or lower. The value obtained by dividing the fourth power of the B concentration by the cube of the Si concentration was $130 \times 10^{19}/cm^3$ in the same area.

The same test as comparative example 1 described above was carried out ten times, and the same measurements were taken.

The result was C0.8/C0.1<1.4 in both cases. The value of crystallinity evaluated in terms of etch pit density was 150 to 400 etch pits/cm$^2$ in an area in which the solidification ratio in the ingot was 0.6 of higher and 0.8 or lower, and the value obtained by dividing the fourth power of the B concentration by the cube of the Si concentration was $52 \times 10^{19}$ to $550 \times 10^{19}$/cm$^3$.

Comparative Example 2

The same GaAs compound raw material as that used in example 1 was synthesized in a separate synthesizing reactor and used as the GaAs compound raw material, but the Si dopant raw material was not introduced into the lower portion of the GaAs compound raw material, and loading was carried out in a normal manner. The amount of Si dopant that was loaded at this time was 260 wt ppm. Crystal growth was carried out without stirring, but otherwise the same apparatus and raw materials were used and the same operation was carried out as described in example 1 to obtain a GaAs ingot.

The carrier concentration of the GaAs ingot obtained in this manner was $0.9 \times 10^{18}$/cm$^3$ in an area in which the solidification ratio was 0.1 (C0.1), the carrier concentration was $12.3 \times 10^{18}$/cm$^3$ in an area in which the solidification ratio was 0.8 (C0.8), and the ratio C0.8/C0.1 was 13.7.

The value of crystallinity evaluated in terms of etch pit density was 45 etch pits/cm$^2$ in an area in which the solidification ratio in the ingot was 0.6 of higher and 0.8 or lower. The value obtained by dividing the fourth power of the B concentration by the cube of the Si concentration was $2.5 \times 10^{19}$/cm$^3$.

The same test as comparative example 2 described above was carried out ten times, and the same measurements were taken.

The result was C0.8/C0.1>10 in both cases. The value of crystallinity evaluated in terms of etch pit density was 12 to 48 etch pits/cm$^2$ in an area in which the solidification ratio in the ingot was 0.6 of higher and 0.8 or lower, and the value obtained by dividing the fourth power of the B concentration by the cube of the Si concentration was $2.5 \times 10^{19}$ to $4.7 \times 10^{19}$/cm$^3$.

Comparative Example 3

A GaAs compound raw material was synthesized in a separate synthesizing reactor in the same manner as in example 1 and used as the GaAs compound raw material, but the Si dopant raw material was not introduced into the lower portion of the GaAs compound raw material, and loading was carried out in a normal manner. The amount of Si dopant that was loaded at this time was 260 wt ppm. Other than that described above, the same apparatus and raw materials were used and the same operation was carried out as described in example 1 to obtain a GaAs ingot.

The carrier concentration of the GaAs ingot obtained in this manner was $0.9 \times 10^{18}$/cm$^3$ in an area in which the solidification ratio was 0.1 (C0.1), the carrier concentration was $1.1 \times 10^{18}$/cm$^3$ in an area in which the solidification ratio was 0.8 (C0.8), and the ratio C0.8/C0.1 was 1.22.

The value of crystallinity evaluated in terms of etch pit density was 75 etch pits/cm$^2$ in an area in which the solidification ratio in the ingot was 0.6 of higher and 0.8 or lower. The value obtained by dividing the fourth power of the B concentration by the cube of the Si concentration was $3.2 \times 10^{19}$/cm$^3$.

The same test as comparative example 3 described above was carried out ten times, and the same measurements were taken.

The result was C0.8/C0.1<1.4 in both cases. The value of crystallinity evaluated in terms of etch pit density was 65 to 360 etch pits/cm$^2$ in an area in which the solidification ratio in the ingot was 0.6 of higher and 0.8 or lower, and the value obtained by dividing the fourth power of the B concentration by the cube of the Si concentration was $3.0 \times 10^{19}$ to $16 \times 10^{19}$/cm$^3$.

Comparative Example 4

The same apparatus and raw material as those described in example 1 were used, but the Si dopant was placed in a position at 1,310° C. (position β described in FIG. 8) rather than 1,281° C. when the dopant was introduced into the GaAs compound raw material. The same operation as in example 1 was then carried out to produce a GaAs ingot.

The carrier concentration of the resulting GaAs ingot was $0.9 \times 10^{18}$/cm$^3$ in an area in which the solidification ratio was 0.1 (C0.1), the carrier concentration was $1.1 \times 10^{18}$/cm$^3$ in an area in which the solidification ratio was 0.8 (C0.8), and the ratio C0.8/C0.1 was 1.22.

The value of crystallinity evaluated in terms of etch pit density was 69 etch pits/cm$^2$ in an area in which the solidification ratio in the ingot was 0.6 or higher and 0.8 or lower.

The same test as comparative example 4 described above was carried out ten times, and the same measurements were taken.

The result was C0.8/C0.1<1.4 in both cases. The value of crystallinity evaluated in terms of etch pit density was 60 to 300 etch pits/cm$^2$ in an area in which the solidification ratio in the ingot was 0.6 of higher and 0.8 or lower.

KEY

Figure 1:
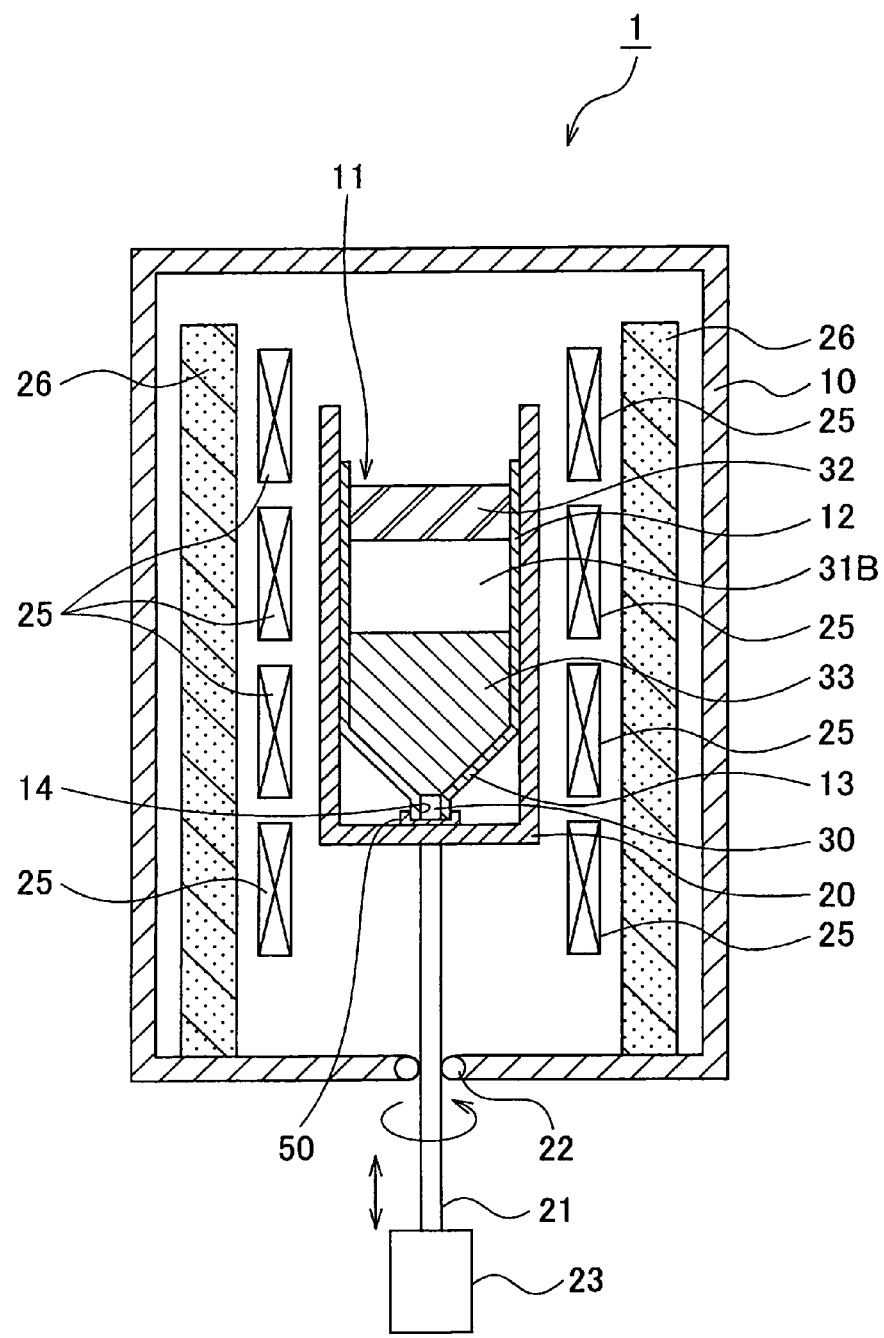
FIG. 1 is a longitudinal sectional view schematically showing the configuration of a crystal growing apparatus.
Figure 2:
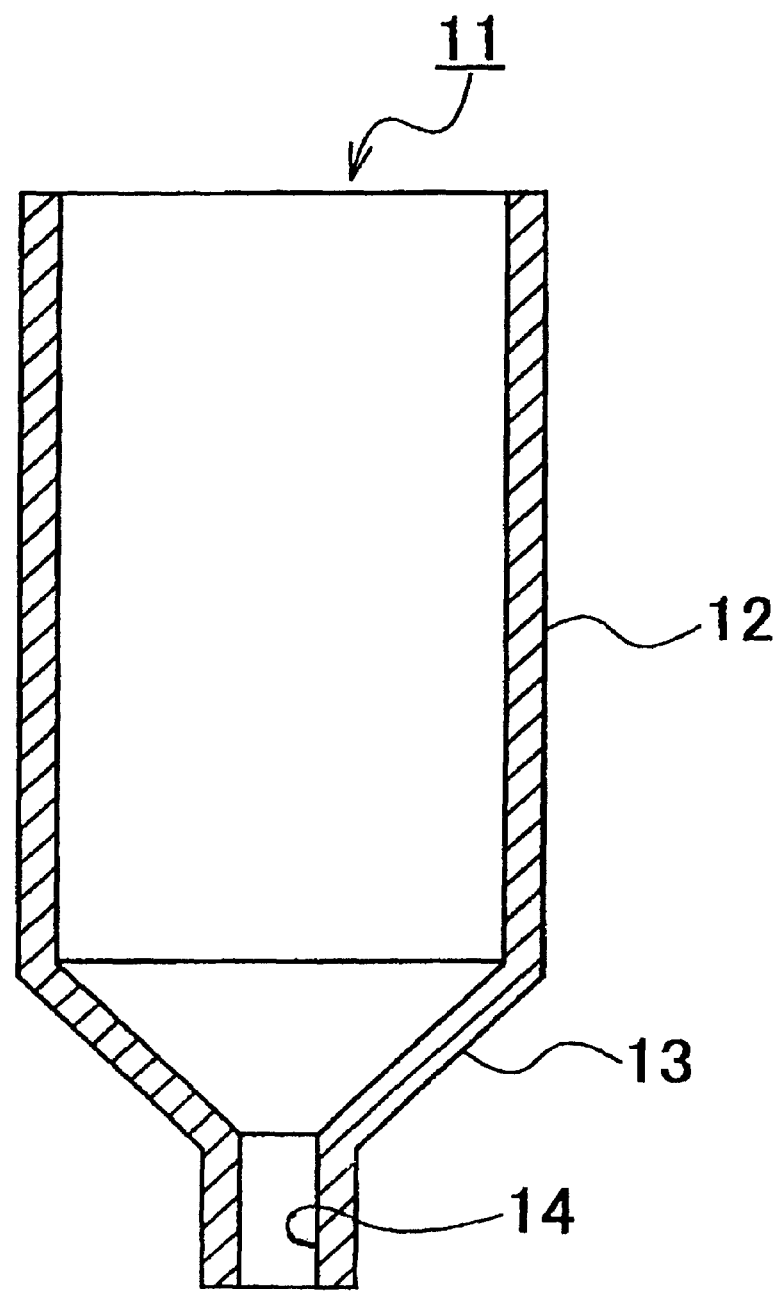
FIG. 2 is a longitudinal sectional view of a crucible.
Figure 3:
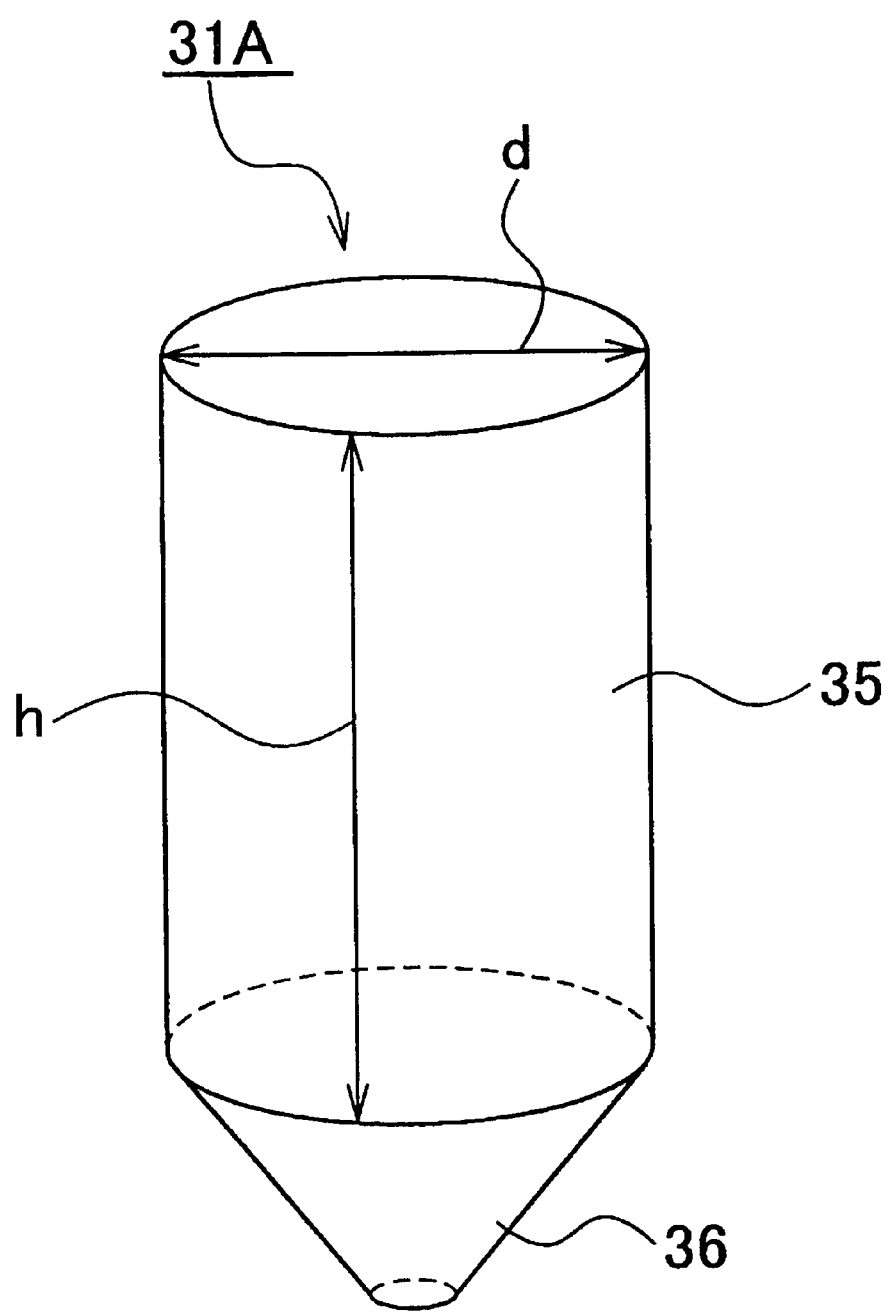
FIG. 3 is a perspective view of a GaAs compound raw material prior to introducing Si.
Figure 4:
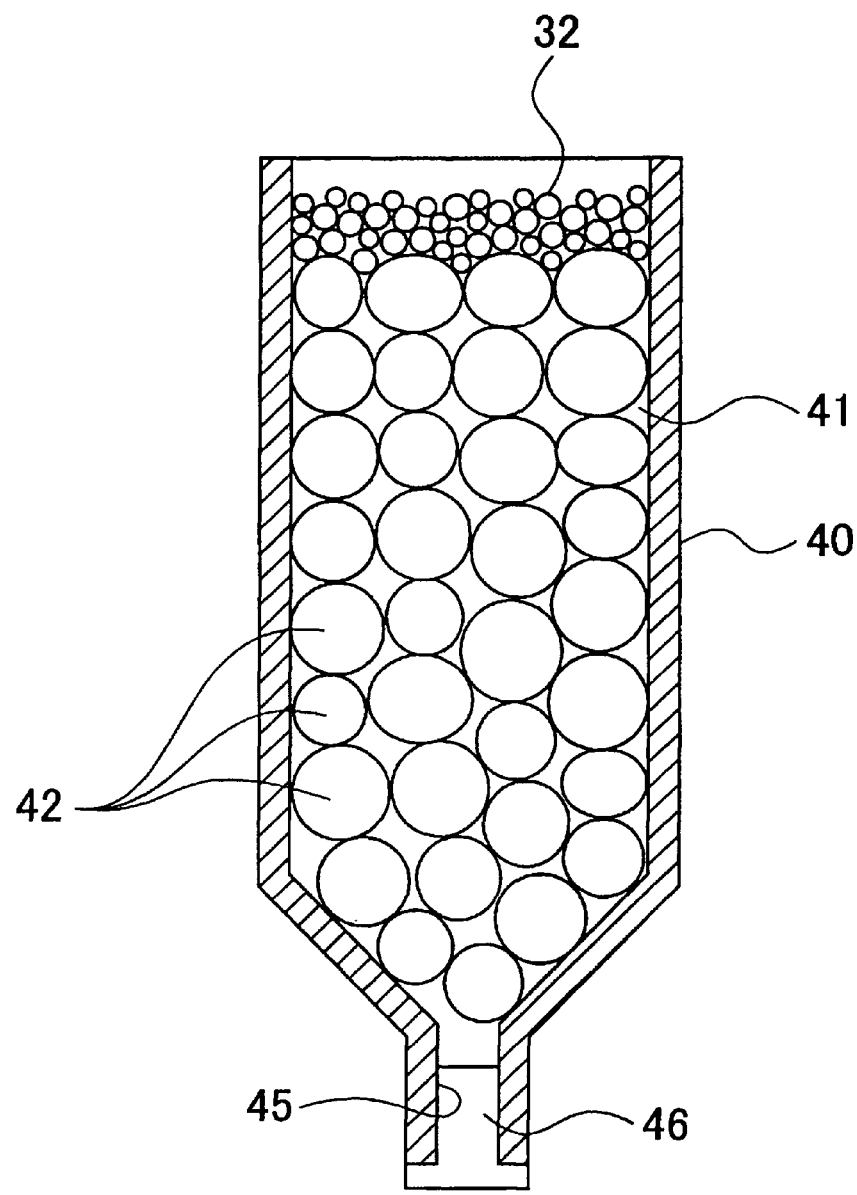
FIG. 4 is a cross-sectional view the manner in which Ga raw material, As raw material, and other materials are loaded into a crucible for synthesizing a GaAs compound raw material.
Figure 5:
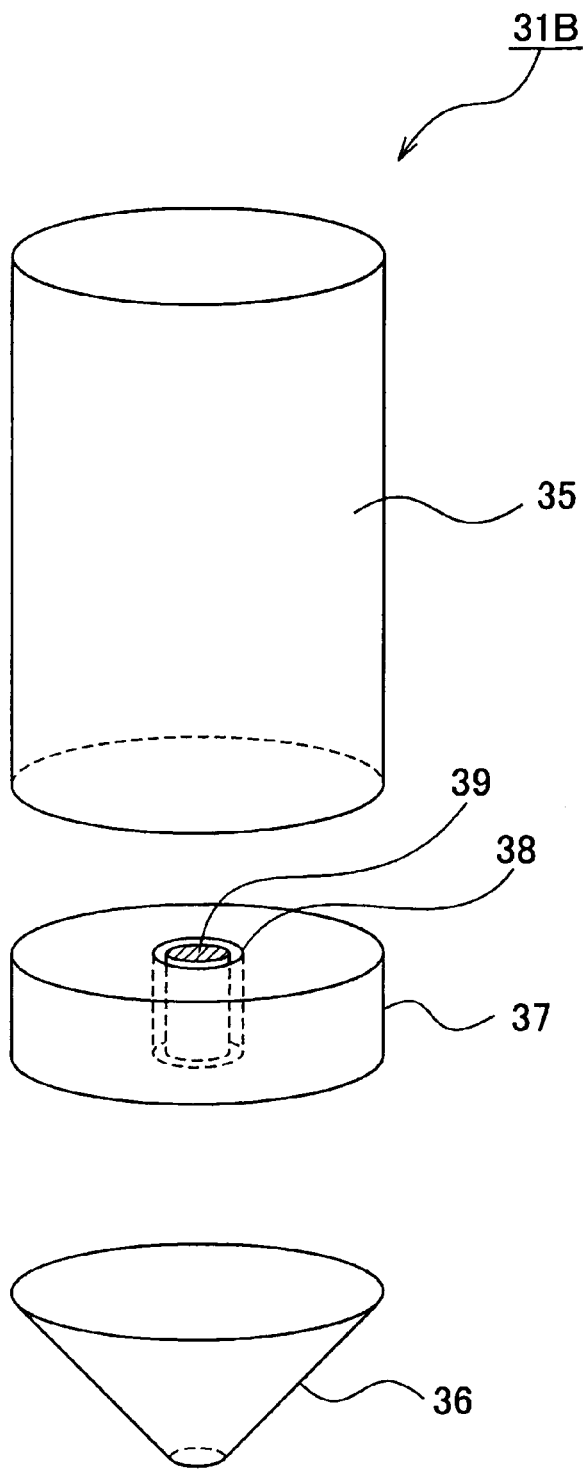
FIG. 5 is a perspective view of the manner in which a dopant raw material is introduced into the GaAs compound raw material.
Figure 6:
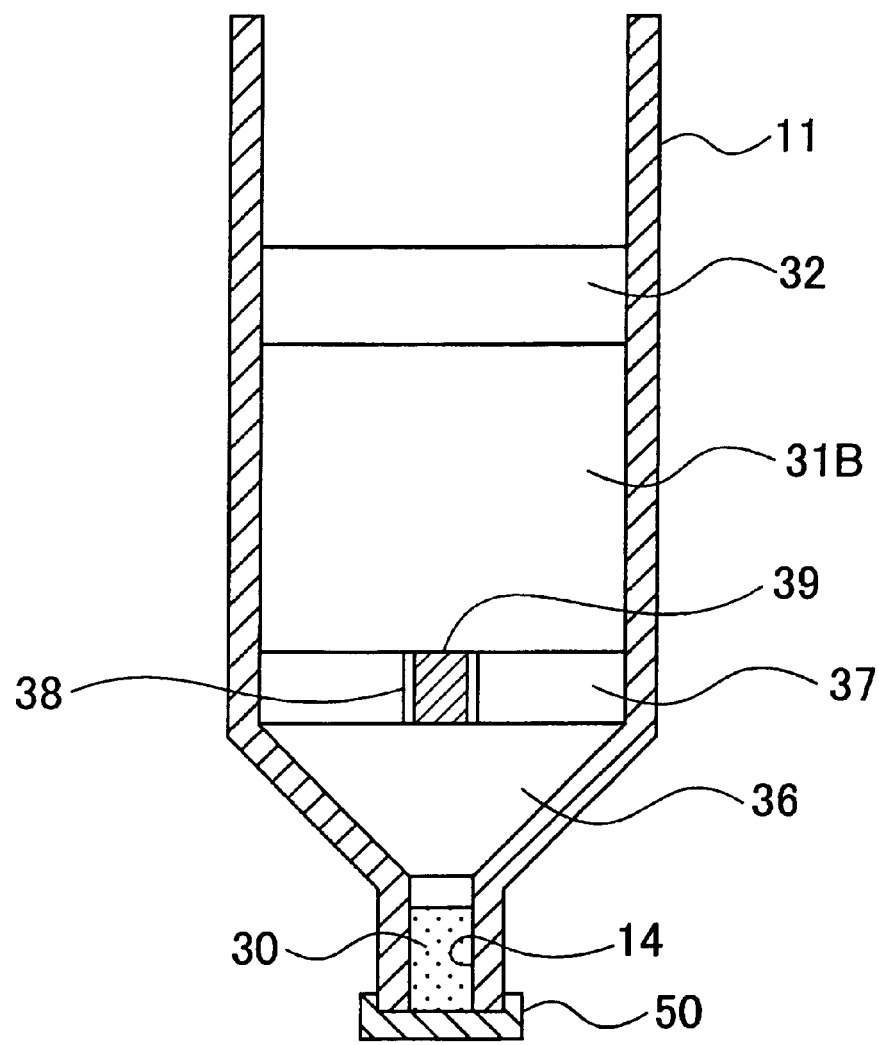
FIG. 6 is a cross-sectional view of a GaAs compound raw material that has been loaded into the crucible of a crystal growing apparatus.
Figure 7:
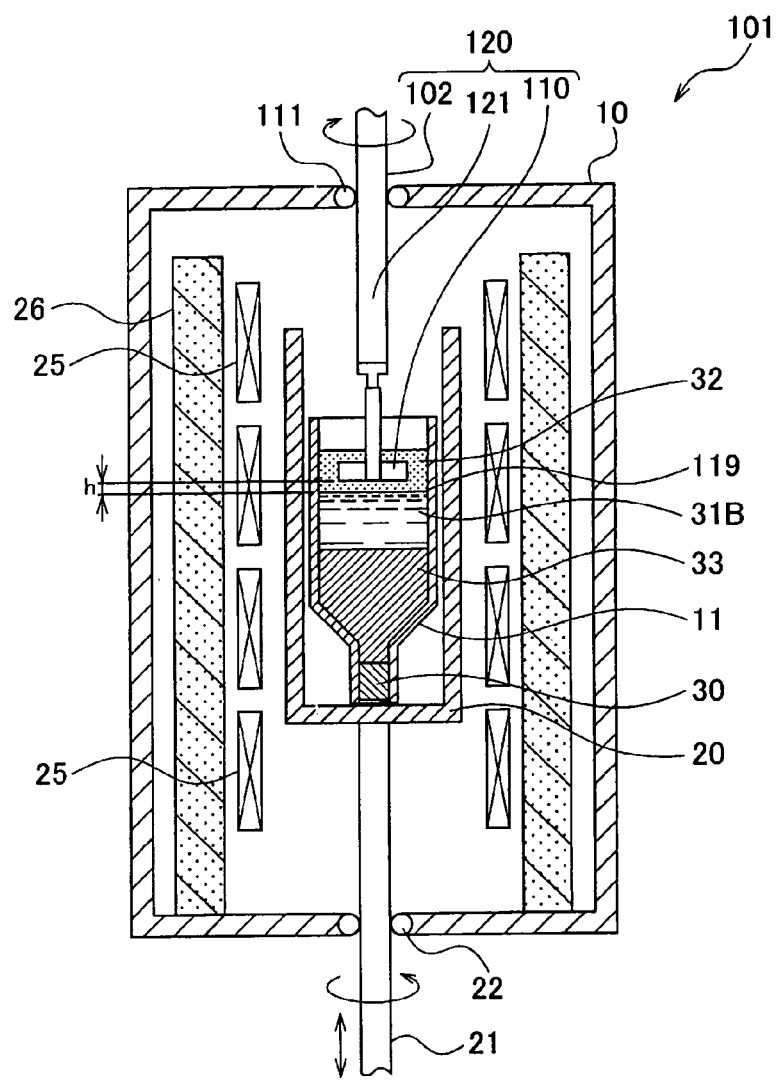
FIG. 7 is a longitudinal sectional view showing a crystal growing apparatus that has a stirring member.
Figure 8:
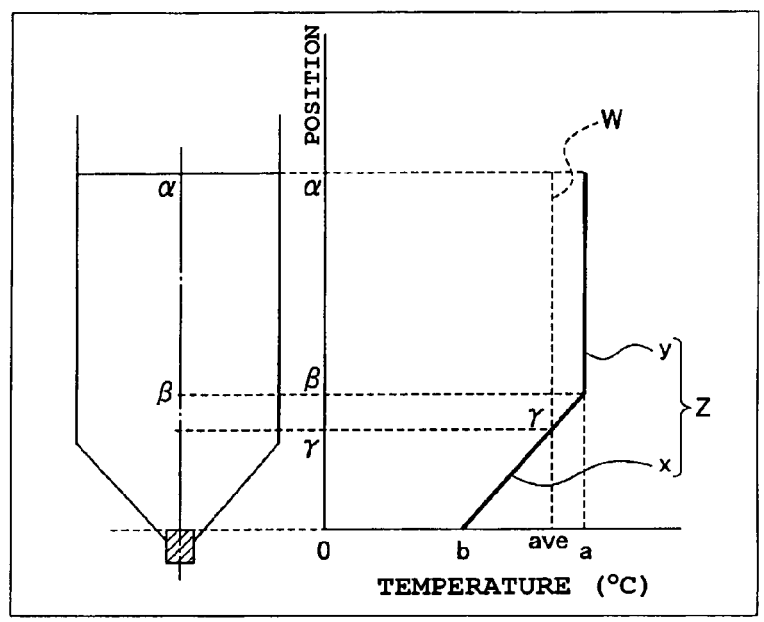
FIG. 8 is a graph showing the temperature at each position of the GaAs compound raw material.

1 Crystal growing apparatus
10 Airtight container
11 Crucible
12 Cylindrical portion of the crucible
13 Conical portion of the crucible
14 Seed crystal portion
20 Crucible-holding container
21 Rod 22 Seal ring
23 Rotating elevator mechanism
25 Heater
26 Insulation
30 Seed crystal
31A GaAs compound raw material
31B Si-holding GaAs raw material
32 Liquid sealant
35 Ingot
36 Cylindrical portion
37 Truncated conical portion
38 GaAs doughnut plate
39 Doughnut-shaped inner hole
39 Dopant
40 Crucible
41 Ga raw material
42 As raw material
45 Seed crystal portion
46 Spacer
50 Gap
101 Crystal growing apparatus having a stirring member
102 Upper rod
110 Stirring plate
111 Seal ring
119 Lower end of the stirring plate
120 Stirring member
121 Rotating shaft

The invention claimed is:

1. An Si-doped GaAs single crystal ingot for producing an Si-doped GaAs single crystal wafer, wherein the Si-doped GaAs single crystal ingot is one in which
C0.8/C0.1<2.0, where C0.1 is the carrier concentration in a portion in which the solidification ratio of said ingot is 0.1, and C0.8 is the carrier concentration in a portion in which the solidification ratio of said ingot is 0.8; and
the average value of crystallinity evaluated in terms of etch pit density is 50 etch pits/cm² or less in an area in which the solidification ratio is 0.1 or higher and 0.8 or lower, wherein
the carrier concentration is a density of electrons or holes at the portion of the ingot in which the solidification ratio of said ingot is either 0.1 or 0.8, and
the solidification ratio is a parameter that designates a specific cross section of the ingot, the specific cross section corresponding to a cross section formed when the solidification that accompanies the ingot growth has progressed to a certain extent in an ingot growing process in which cooling is started for a melted GaAs raw material melted in a crucible placed in a crystal growing apparatus.

2. The Si-doped GaAs single crystal ingot of claim 1, wherein the Si-doped GaAs single crystal ingot is one which C0.8/C0.1<1.4.

3. The Si-doped GaAs single crystal ingot of claim 2, wherein the Si-doped GaAs single crystal ingot is one in which the average value of crystallinity evaluated in terms of etch pit density of 10 etch pits/cm² or less in an area in which the solidification ratio is 0.1 or higher and 0.8 or lower.

4. The Si-doped GaAs single crystal ingot of claim 1, wherein the Si-doped GaAs single crystal ingot is one in which the carrier concentration is $1.0 \times 10^{17}/cm^3$ or higher and $1.0 \times 10^{19}/cm^3$ or lower in an area in which the solidification ratio in said ingot is 0.1 or higher and 0.8 or lower.

5. An Si-doped GaAs single crystal wafer produced from an area in which said solidification ratio is 0.6 or higher and 0.8 or lower in the Si-doped GaAs single crystal ingot of claim 1, wherein the Si-doped GaAs single crystal wafer is one in which
the average value of crystallinity evaluated in terms of etch pit density is 50 etch pits/cm² or less.

6. The Si-doped GaAs single crystal wafer of claim 5, wherein the Si-doped GaAs single crystal wafer is one in which the average value of crystallinity evaluated in terms of etch pit density is 10 etch pits/cm² or less.

7. The Si-doped GaAs single crystal wafer of claim 5, wherein the Si-doped GaAs single crystal wafer is one in which the carrier concentration is $1.0 \times 10^{17}/cm^3$ or higher and $1.0 \times 10^{19}/cm^3$ or lower.

* * * * *